United States Patent [19]

Brunolli

[11] Patent Number: 4,813,023

[45] Date of Patent: Mar. 14, 1989

[54] SYSTEM EMPLOYING NEGATIVE FEEDBACK FOR DECREASING THE RESPONSE TIME OF A CELL

[75] Inventor: Michael J. Brunolli, Escondido, Calif.

[73] Assignee: Brooktree Corporation, San Diego, Calif.

[21] Appl. No.: 921,530

[22] Filed: Oct. 21, 1986

[51] Int. Cl.$^4$ .............................................. G11C 7/00
[52] U.S. Cl. ...................................... 365/207; 307/418
[58] Field of Search ................ 365/71, 207, 208, 209; 307/418

[56] References Cited

U.S. PATENT DOCUMENTS 3,274,570  9/1966  Brekne ................................ 365/209

Primary Examiner—James W. Moffitt
Attorney, Agent, or Firm—Ellsworth R. Roston; Charles H. Schwartz

[57] ABSTRACT

First and second lines respectively receive first and second complementary input signals representing a binary bit. Each of the input signals has first and second logic levels respectively corresponding to a binary "1" and a binary "0". The input signals produce a current through a load in accordance with the relative logic levels of the first and second input signals. The difference between the logic levels of the input signals is amplified and introduced as a negative feedback to a particular one of the first and second lines in accordance with the relative logic levels of the signals on the lines. The feedback causes a current to be produced in the load with a polarity opposite to the polarity of the current produced in the load by the input signals and with a magnitude less than the magnitude of the current produced in the load by the input signals. The negative feedback is effective in minimizing the time for the load to respond to changes in the relative logic levels of the first and second input signals. In this way, the frequency of response of a system including the circuitry of this invention can be significantly increased. The embodiment described above may be used in a system in which first particular input signals are provided to identify a selected word and second particular input signals are provided to identify a bit in the word one and in which a cell (a load) is selected common to the selected word and the selected bit. The circuitry described above may be included to minimize the time for producing in the load a signal representative of the selective of such cell.

19 Claims, 2 Drawing Sheets

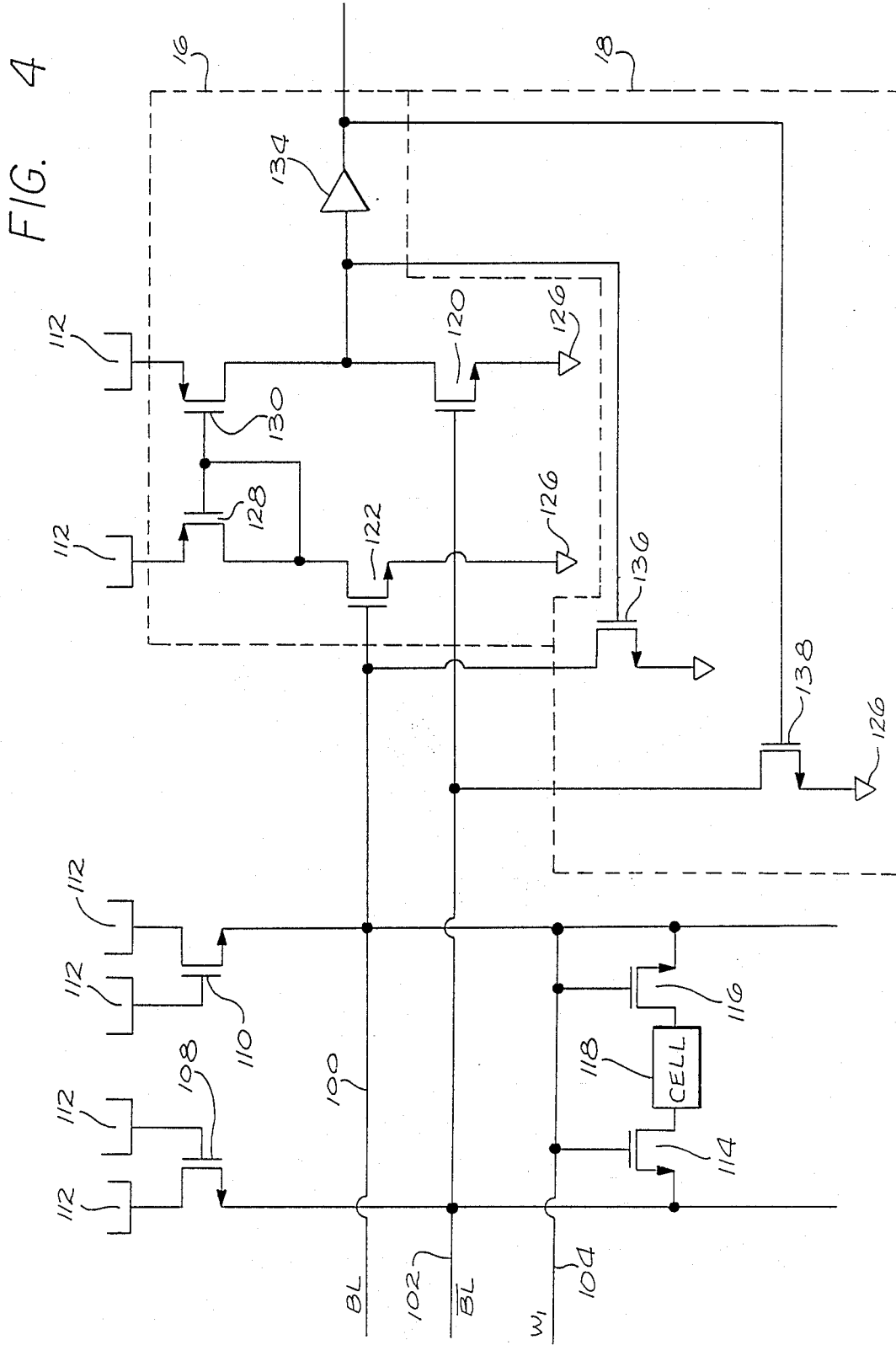

SYSTEM EMPLOYING NEGATIVE FEEDBACK FOR DECREASING THE RESPONSE TIME OF A CELL

This invention relates to a system for increasing the speed of response of a load such as a cell to binary input signals. More particularly, the invention relates to systems for providing negative feedbacks to input lines to minimize the time for a load such as a cell to respond to binary input signals.

As new generations of data processing systems are developed and placed into use, the systems become progressively sophisticated in a number of significant respects. The computers become progressively reduced in size, partly because the integrated circuit chips providing the electrical circuitry for the data processing chips become reduced in size. Even as the data processing chips become reduced in size, their data processing capabilities become enhanced. As a result, progressive generations of data processing systems have expanded capabilities even as their size becomes reduced. Furthermore, partly because of the decreases in the size of the integrated circuit chips and the increased density of the circuitry on such chips, the speed of processing data in the successive generations of data processing systems has become materially enhanced.

In spite of all of the advances made in data processing systems in the past several decades, anxiety as to apparent limitations in the capabilities of data processing systems still persists. For example, data processing systems are used in industrial equipment to regulate, on the basis of real time, the values of such parameters as temperature, pressure and humidity. In such systems, the operation of the industrial equipment is evaluated by the data processing system to determine what changes, if any, have to be made in such parameters as temperature, pressure and humidity. As will be apprciated, if the speed of processing the data can be increased, the time is shortened between the introduction to the data processing system of information relating to the operation of the industrial equipment and the time for adjusting the parameters in the equipment. As this time is reduced, the precision in the operation of the industrial equipment can be enhanced.

The speed of response of the data processing systems now in use is limited by inadequacies in the speed of response of certain basic elements in the data processing system. For example, the data processing system include cells each identified by an individual word and an individual bit in the word. Each of these cells may constitute an individual portion in a memory. Each of these cells becomes individually energized when there is a commonality of signals on the lines identifying the word and the bit in the word. Stages including sense amplifiers and read and writer amplifiers are associated with each cell identify the commonality of the input signals on the word line and the bit line. These amplifiers may be considered as defining a load for each cell.

The parameters of the load and the associated circuitry for driving the load prevent the load from responding instantaneously to the word and bit signals identifying the load. This limits the speed at which the system is able to process data. For example, part of the delay in response results from the relatively great difference in magnitude between the voltage coding on a line for a binary "1" for a bit and the voltage coding on a complementary line for a binary "0" for the bit. Because of this relatively great difference in the magnitudes of such voltages, an excessive amount of time occurs in changing the voltage difference from one polarity to an opposite polarity as when a binary value is changed from a "1" to a "0". Furthermore, the logic levels of the voltages on the complementary pair of lines change relatively slowly as when the voltages for the complementary pair change from logic levels coding for a binary "1" to logic levels coding for a binary "0".

Since the cells and the circuitry for driving the cells are central to every data processing system, it is important to minimize the time for such cells and such driving circuitry to respond to data processing signals. This has been appreciated for decades. As a result, during this extended period of time, attempts have been made to minimize, or at least materially reduce, the time for the cells and the associated driving circuitry to respond to data processing signals. Some progress has been made in this respect. However, the progress has not been nearly as great as the significance of the problem would warrant.

This invention provides a system for significantly reducing the time in which the cells and the associated driving circuitry in a data processing system respond to data processing signals. The system significantly reduces such time by providing a feedback signal to the driving circuitry for minimizing the difference in the logic levels of the voltage coding for a binary "1" and the voltage coding for a binary "0" in a complementary pair of lines. The system of this invention also reduces the time of response of the cells and associated driving circuitry by increasing the slope at which the logic levels of the voltages on the complementary pair of lines changes when the binary information in the lines changes as from a binary "1" to a binary "0".

In one embodiment of the invention, first and second lines respectively receive first and second complementary input signals representing a binary bit. Each of the input signals has first and second logic levels respectively corresponding to a binary "1" and a binary "0". The input signals produce a current through a load in accordance with the relative logic levels of the first and second input signals.

The difference between the relative logic levels of the input signals is amplified and introduced as a negative feedback to a particular one of the first and second lines in accordance with the relative logic levels of the signals on the lines. The feedback causes a current to be produced in the load with a polarity opposite to the polarity of the current produced in the load by the input signals and with a magnitude less than the magnitude of the current produced in the load by the input signals.

The negative feedbacks is effective in minimizing the time for the load to respond to changes in the relative logic levels of the first and second input signals. In this way, the frequency of response of a system including the circuitry of this invention can be significantly increased. For example, the time for driving the load from one state of operation to the other state of operation can be reduced from a period of approximately four nanosecnds (4 ns) to a period of less than two nanoseconds (2 ns).

The embodiment described above may be used in a system in which first particular input signals are provided to identify a selected word and second particular input signals are provided to identify a bit in the word one and in which a cell (a load) is selected common to the selected word and the selected bit. The circuitry described above may be included to minimize the time for producing in the load a signal representative of the selection of such cell.

In the drawings:

FIG. 4 is a circuit diagram of one embodiment of this invention when used in a data processing system for identifying an individual cell by a coincidence of signal defining a word and a bit individual to that cell.

Figure 1:
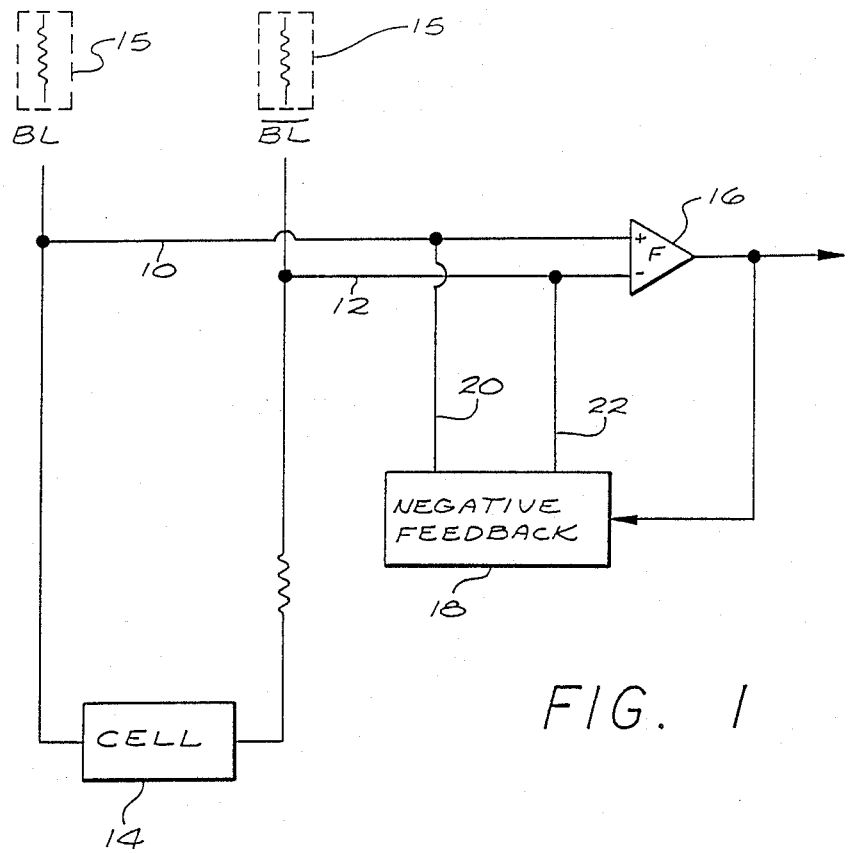
FIG. 1 is a simplified circuit diagram of one embodiment of the invention for minimizing the time of response of a cell and the associated driving circuitry to input siganls introduced to such associated driving circuitry.

FIG. 1 illustrates a simplified circuit diagram of one embodiment of the invention. The embodiment shown in FIG. 1 includes a pair of complementary input lines 10 and 12. The lines 10 and 12 respectively receive complementary input signals such as for a bit line (BL). Each of the signals on the input lines 10 and 12 has first and second logic levels. One binary level represents a true state and the other logic level represents a false state. The signals are complementary in that the signals on the line 10 has one logic level and the signal on the other line concurrently has the other logic level. As a result, a BL signal is produced on the line 10 and a $\overline{BL}$ signal is produced on the line 12.

The lines 10 and 12 may be respectively connected to opposite terminals of a cell 14. The cell 14 may constitute an individual position in a memory. Various stages including sense amplifiers and read and write amplifiers may be associated with each cell and may be considered to define a load which may be included in a circuit with the cell. The read amplifier may be provided to read binary information from the cell and the write amplifier may be provided to records binary information in the cell. The construction and operation of sense amplifiers, read amplifiers and write amplifiers are well known in the art. The load defined by the sense amplifier, the read amplifier and the write amplifier associated with each cell is schematically illustrated at 15 in FIG. 1, a portion of the load 15 being provided in each of the lines 10 and 12.

The lines 10 and 12 are connected to input terminals of a sense amplifier 16 which may be constructed in a manner well known in the art. The output of the sense amplifier 16 is connected to a stage 18 which provides a negative feedback. Connections are respectively made from output terminals of the negative feedback 18 through lines 20 and 22 to the lines 10 and 12. The construction of the sense amplifier 16 and the negative feedback 18 are well known in the art.

Figure 2:
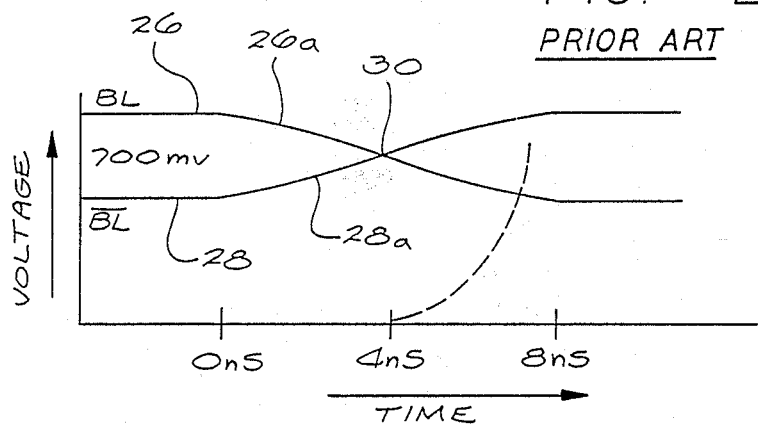
FIG. 2 illustrates the response time of a cell and the associated driving circuitry in the system of the prior art.

FIG. 2 ilustrates voltages waveforms produced with reference to time in a system of the prior art. In FIG. 2, time is illustrated along the horizontal axis and voltage is illustrated along the vertical axis. The voltage on the line 10 is illustrated at 26 and the voltage on the line 12 is illustrated at 28. As will be seen in FIG. 2, the signal BL is true when the voltage 26 on the line 10 exceeds the voltage 28 on the line 12. This voltage difference may illustratively be in the order of seven hundred millivolts (700 mV).

When the signals on the lines 10 and 12 change from a binary value of "1" to a binary value of "0" in a system of the prior art, the voltage on the line 10 decreases as illustrated at 26a and the voltage on the line 12 increases as illustrated at 28a. The cell 14 does not respond to these changes in signal amplitude until some time after a crossover point 30 is reached. This crossover point may occur as much as four nanoseconds (4 ns) after the change in signal amplitude starts to occur. As a result, the cell 14 does not start to respond to the change in the signal from BL to $\overline{BL}$ for at least four (4) nanosconds. The cell 14 then requires several nanoseconds to respond because of delays produced such as by distributed capacitance in various stages in the cell. As a result, the response time of the circuitry of the prior art to changes in bit information such as from BL to $\overline{BL}$ is relatively slow.

Figure 3:
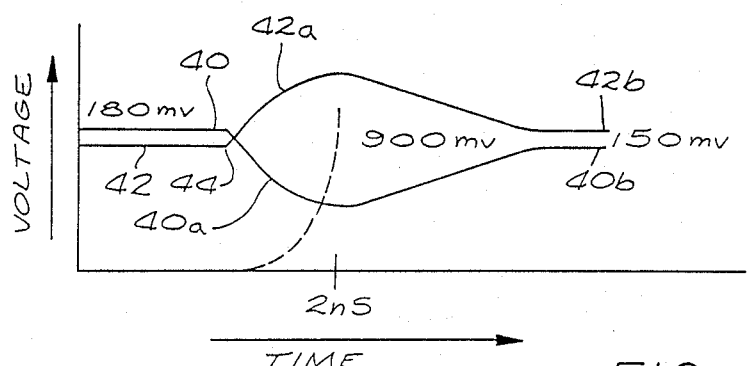
FIG. 3 illustrates the response time of a cell and the associated driving circuitry in the system shown in FIG. 1.

The system shown in FIG. 1 operates to shorten significantly the response time of the system to changes in bit information such as a change from BL to $\overline{BL}$. For example, if the signals on the lines 10 and 12 at the left end of FIG. 3 represent a binary value of BL, the voltage on the line 12 exceeds the voltage on the line 10 in FIG. 3 in a manner similar to that described above. The relative voltages on the lines 10 and 12 produce a flow of current downwardly through the the load 15 and to the left through the cell 14. This current may illustratively have an amplititude in the order of one milliampere (1 ma).

The voltage difference on the lines 10 and 12 is amplified and inverted as at 16 so that the output voltage from the amplifier indicates a negative difference between the voltages. The negative feedback 18 then introduces this voltage to the line 10 in a direction to produce a current downwardly and to the right through the cell 14. This current is in a direction opposite to the current produced in the cell 14 by the signal BL. The amplitude of this opposite current is a predetermined fraction of the current produced in the cell 14 by the signal BL. For example, when the current produced in the cell 14 by the signal BL is one (1) milliampere, the opposition current through the cell may be in the order of one half of a milliampere (0.5 ma). As a result of this opposition current, the voltage difference between the lines 10 and 12 may be reduced to a value in the order of one hundred and fifty millivolts (150 mv). This is respectively indicated in FIG. 3 by levels 40 and 42 for the voltages on the lines 10 and 12.

When the signals on the lines 10 and 12 change from a value of BL to a value of $\overline{BL}$, the voltage on the line 10 decreases and the voltage on the line 12 increases. This is illustrated at 40a and 42a in FIG. 3. As the voltages on the lines 10 and 12 change past a crossover point 44, a current tends to flow through the cell 14 in a direction toward the right in FIG. 1. This current is the same direction as the opposition current produced by the negative feedback 18. As a result, the rate of change of the voltages in the lines 10 and 12 tends to be initially greater than the rate of change of the voltage produced in these lines in the prior art such as illustrated at 26a and 28a in FIG. 2.

As will be appreciated, a crossover 44 is produced in FIG. 3 at a time considerably shorter than in FIG. 1 from the time that the values of the signals on the lines 10 and 12 start to change from BL to $\overline{BL}$. This results in part from the relatively small difference between the voltages 40 and 42. It also results in part from the increased slope of the signals 40a and 42a relative to the slope of the signals 28a and 26b. As a result, the sense amplifier 16 starts to respond much faster in the system of FIG. 1 than in the prior art to a change in the signal from BL to $\overline{BL}$. For example, the sense amplifier 16 may respond in a period of less than two nanoseconds (2 ns) in comparison to a response time of approximately four nanoseconds (4 ns) in the systems of the prior art.

As will be seen in FIG. 3, the signals 40a and 42a tend to overshoot beyond their settled values. This tends to insure that the signals introduced to the sense amplifier 16 will produce a current in the proper direction in the amplifier. During the time that the signals 40a and 42a are settling to their proper values, the sense amplifiers 16 is overcoming its electrical inertia. This inertia may result from the operation of various stages in the sense amplifier and particularly from the operation of distributed capacitances in such stages. As a result, at approximately the time that the signals 40a and 42a reach their steady state values 40b and 42b, the sense amplifier responds to the signals 40a and 42a produced just beyond the crossover 44. In this way, no dead time results from the period during which transients exist in the signals 40a and 40b.

FIG. 4 illustrates a specific embodiment of the invention shown in FIG. 1. In the embodiment of the invention shown in FIG. 4, a pair of complementary lines 100 and 102 are provided respectively to receive signals such as $BL_1$ and $\overline{BL}_1$. The signals $BL_1$ and $\overline{BL}_1$ indicate the occurrence, or lack of occurrence, of a first bit in a word which may have any predetermined number of bits such as thirty two (32) bits. Similarly, a line 104 is provided to receive a signal such as $W_1$. The signal $W_1$ indicates the occurrence, or lack of occurrence, of a first word in a data processing system which may have any desired number of words.

The signals on the lines 100 and 102 are respectively applied to the sources of transistors 110 and 108 which may be of the n-type. The drains of the transistors 108 and 110 receive positive voltages from a voltage source 112. The gates of the transistors 108 also receive positive voltages from the voltage source 112.

The voltages on the sources of the transistors 108 and 110 are respectively applied to the source of transistors 114 and 116 which may be of the n-type. The gates of the transistors 114 and 116 receive the voltages on the line 104. The drains of the transistors 114 and 116 are connected to the opposite terminals of a cell 118 corresponding to the cell 14 in FIG. 1.

Connections are respectively made from the sources of the transistors 108 and 110 to the gates of transistors 120 and 122, which may be of n-type. The sources of the transistors 120 and 122 are common with a reference potential such as a ground 126. The drain of the transistor 122 has a common connection with the gates of transistors 128 and 130, which may be of the p-type, and also with the drain of the transistor 128. The sources of the transistors 128 and 130 receive a positive voltage from the voltage source 112. The transistors 120, 122, 128 and 130 and the amplifier 134 may be included within the amplifier 16 in FIG. 1, as shown by broken lines in FIG. 4.

The drain of the transistor 130 is common with the drain of the transistor 120, with the input terminal of an amplifier 134 and with the gate of a transistor 136, which may be of the n-type. The sources of the transistor 136 (which may also be of the n-type) and a transistor 138 may receive the reference potential such as the ground 126. The gate of the transistor 138 is common with the output terminal of the amplifier 134. The voltages on the drains of the transistors 136 and 138 are respectively introduced to the sources of the transistors 110 and 108. The transistors 136 and 138 may be included within the negative feedback 18 in FIG. 4, as shown by broken lines.

When a BL signal is produced on the line 100 to indicate the selection of bit 1 in a word, the current through the transistor 108 is greater than the current through the transistor 110 because the voltage on the source of the transistor 108 is lower than the voltage on the source of the transistor 110. If a positive signal also appears on the line 104 to indicate the selection of word 1 in the plurality of words, a current accordingly flows through the cell 118 in a direction toward the left in FIG. 4.

Because of the introduction of the BL signal to the gate of the transistor 122, the transistor 122 is more conductive than the transistor 120. Because of this difference in current flow, the voltage on the drain of the transistor 122 is accordingly more negative than the voltage on the drain of the transistor 120. The transistors 128 and 130 set as a current mirror which is dependent upon the current through the transistor 122. This current mirror causes the transistor 130 to be more conductive than the transistor 128 so that the voltage on the drain of the transistor 130 will be lower than the voltage on the drain of the transistor 128.

The low voltage on the drain of the transistor 130 is inverted in the amplifier 134 and introduced as a high voltage to the gate of the transistor 138. As a result, the transistor 138 will be more conductive than the the transistor 136. This will tend to increase the voltage on the source of the transistor 108 so that the voltage on the source of the transistor 108 approaches the voltage on the source of the transistor 110. In view of this, the voltage difference on the sources of the transistors 108 and 110 will be minimized.

In like manner, for a value of $\overline{BL}_1$, current will flow through the cell 118 in the direction toward the right in FIG. 4 because of a greater current in the transistor 110 than in the transistor 108. The signal $\overline{BL}_1$ will also cause the current through the transistor 120 to be greater than the current through the transistor 122 and the current through the transistor 128 to be greater than the current through the transistor 130. The resultant increase in the voltage on the drain of the transistor 130 causes the transistor 136 to be more conductive than the transistor 138. This produces an increase in the voltage on the source of the transistor 110 so that the voltage on the source of the transistor 110 approaches the voltage on the source of the transistor 108.

The transistors 136 and 138 are provided with particular parameters relative to the transistors 114 and 116. For example, the size of the transistors 136 and 138 may be smaller by a particular amount than the size of the transistors 114 and 116. In this way, the current through the transistors 136 and 138 will be less by a particular amount than the current produced in the cell 114 by the $BL_1$ and $W_1$ signals. Accordingly, the voltage difference produced between the sources of the transistors 108 and 110 as a result of the negative feedback of this invention can be pre-selected to any desired value.

Although this invention has been disclosed and illustrated with reference to particular embodiments, the principles involved are suspectible for use in numerous other embodiments which will be apparent to persons skilled in the art. The invention is, therefore, to be limited only as indicated by the slope of the appended claims.

I claim:

1. In combination,
a first line,
a second line,
means for providing a first binary input signal having first and second logic levels and a second binary input signal having one of the second and first logic levels at the same time as the occurrence of the other one of the first and second logic levels of the first binary input signal, the first and second binary input signals coding for a binary bit on a complementary basis,
means for introducing the first binary input signal to the first line,
means for introducing the second binary input signal to the second line at the same time as the introduction of the first binary signal to the first line,
means for amplifying and inverting the difference in the logic levels of the first and second input signals, and
means responsive to the output from the amplifier means for feeding such output back to an individual one of the first and second lines to decrease the difference in the logic levels of the first and second lines.

2. In a combination as set forth in claim 1,
means associated with the first and second lines for producing a current through the individual one of the first and second lines to decrease the difference between the logic levels of the signals on the first and second lines.

3. In a combination as set forth in claim 2,
the feedback means being constructed to provide a feedback current of a smaller amplitude to the individual line than the amplitude of the current flowing through the other line.

4. In combination,
means for providing first and second complementary input signals each having first and second logic levels,
first and second lines respectively connected to receive the first and second complementary input signals,
means connected to the first and second lines for producing a current through an individual one of the lines in accordance with the relative logic levels of the first and second complementary input signals,
means responsive to the first and second complementary input signals for producing a feedback signal representing an inversion of the logic level of the first input signal relative to the logic level of the second input signal, and
means responsive to the feedback signal for introducing the feedback signal to the other one of the first and second lines than the individual line.

5. In a combination as set forth in claim 4,
means for providing the feedback signal with characteristics to provide the feedback signal with a lower amplitude than the signal on the individual one of the lines.

6. In a combination as set forth in claim 5,
the feedback means being constructed to introduce a current to the other line of the same polarity as that produced in the other line upon an inversion in the logic level of the first input signal relative to the logic level of the second input signals.

7. In combination,
first and second input lines,
means for respectively introducing first and second input signals to the first and second lines, each of the first and second input signals having first and second logic levels, the input signals on the first line being complementary logic levels to the input signals on the second line in indicating the value of a binary bit of information,
a cell,
means responsive to the relative logic levels of the signals on the first and second lines for producing through the cell a current representative of the value of the binary bit of information,
means responsive to the relative logic levels of the input signals in the first and second lines for providing a feedback signal having characteristics dependent upon such relative logic levels, and
means responsive to the feedback signal for producing an acceleration in the time of response of the cell to a change in the relative logic levels of the first and second complementary input signals.

8. In a combination as set forth in claim 7,
the accelerating means producing an increase in the slope of the change of the relative logic levels of the first and second complementary input signals on the first and second complementary input lines.

9. In a combination as set forth in claim 7,
the accelerating means providing a shortening of the time at which the logic levels of the signals on the first and second input lines starts to change in response to the introduction to the lines of the first and second input signals.

10. In combination,
a first line for receiving a signal having first and second logic levels respectively representing a binary "1" and a binary "0" for a particular bit of information,
a second line for receiving a signal having the first and second logic levels respectively representing a binary "0" and a binary "1" for the particular bit of information,
a cell,
means responsive to the logic levels of the signals in the first and second lines for the particular bit of information for producing a current through the cell in a direction representative of the relative logic levels of such signals, and
means responsive to the logic levels of the signals on the first and second lines for providing a feedback signal, and
means responsive to the feedback signal for introducing the feedback signal to the cell to minimize the time for the cell to respond to the logic levels of the signals on the first and second lines.

11. In a combination as set forth in claim 10,
the feedback signal means providing a feedback current of lower magnitude than the magnitude of the current produced in the cell in response to the logic levels of the signals in the first and second lines.

12. In a combination as set forth in claim 10,
the cell having a particular response time to changes in the logic levels of the signals in the first and second lines,
the feedback signal means producing changes in voltage in response to the logic levels of the signals in the first and second lines, the initial portion of the voltage changes constituting the feedback to minimize the time for the cell to respond to the logic levels of the signals in the first and second lines, the total response time of the voltage changes in the feedback signal means being less than the response time of the cell to the logic levels of the signals in the first and second lines.

13. In combination, means for providing first and second signals having logic levels respectively coding for true and false states of a particular binary bit, means for providing at least a third signal having logic levels respectively coding for true and false states of a particular word, a cell defined by a coincidence of the particular binary bit and the particular word, means for activating the cell, in accordance with a coincidence in the occurrence of the signals coding for a true state in the particular word and the particular bit, to produce a particular current through the cell, means responsive to the current through the cell for producing a negative feedback signal, and means responsive to the negative feedback signal for introducing the negative feedback signal to the cell to obtain the production of a feedback current through the cell in a direction opposite to the flow of the particular current through the cell to decrease the time for the cell to respond to the logic levels coding in the first and second signals for the true state of the particular binary bit.

14. In a combination as set forth in claim 13, the feedback signal means including switching means for providing for a flow of current through the cell with a polarity opposite to, and a magnitude less than, that produced in the cell by the first and second signals and at least the third signal.

15. In a combination as set forth in claim 13, the feedback signal means including means responsive to the current through the cell for converting this current to a voltage representative of such current and for obtaining the production of a flow of current through the cell with a polarity opposite to, and a magnitude less than, that produced in the cell by the first and second signals and at least the third signal.

16. In combination, first and second complementary input lines, means for respectively introducing first and second complementary input signals to the first and second lines, the first and second input signals being complementary in the relative production of first and second logic levels and being complementary in indicating the value of a binary bit of information in a word, a third line, mean for introducing third input signals to the third line, the third input signal indicating a word, a cell, means responsive to the concurrence of the the first logic levels of the signals on the first and third lines for producing a current through the cell, means responsive to the logic levels of the signals on the first and second lines for producing a feedback signal having characteristics dependent upon such logic levels, and means responsive to the feedback signal for introducing the feedback signal to the cell to minimize the time for the cell to respond to the logic levels of the signals on the first and second lines.

17. In a combination as set forth in claim 16 wherein the feedback means provides the feedback signal with characteristics representing a negative feedback and the time-minimizing means introduces to the cell a current opposite in polarity to, and having a magnitude less than that of, the current produced in the cell by the logic levels of the signals on the first and second lines.

18. In a combination as set forth in claim 17 wherein the time-minimizing means is operative to accelerate the time in which the cell responds to a change in the logic levels of the signals on the first and second lines.

19. In a combination as set forth in claim 17 wherein the feedback means and the time-minimizing means cooperate to produce, in response to the logic levels of the first and second signals, faster and stronger responses in the cell than would be produced if the feedback means and the time-minimizing means were not included.

* * * * *